United States Patent
Guzman et al.

(10) Patent No.: US 10,923,378 B2
(45) Date of Patent: Feb. 16, 2021

(54) MICRO-COMPONENT BATCH TRANSFER SYSTEMS, METHODS, AND DEVICES

(71) Applicant: Seagate Technology LLC, Cupertino, CA (US)

(72) Inventors: Javier I Guzman, Minneapolis, MN (US); I-Fei Tsu, Chanhassen, MN (US); Michael J Conover, Minneapolis, MN (US); Declan Macken, Eden Prairie, MN (US)

(73) Assignee: Seagate Technology LLC, Fremont, CA (US)

(*) Notice: Subject to any disclaimer, the term of this patent is extended or adjusted under 35 U.S.C. 154(b) by 0 days.

(21) Appl. No.: 16/410,874

(22) Filed: May 13, 2019

(65) Prior Publication Data

US 2020/0365439 A1    Nov. 19, 2020

(51) Int. Cl.
*H01L 21/68* (2006.01)
*H01L 33/62* (2010.01)
*H01L 21/67* (2006.01)

(52) U.S. Cl.
CPC ...... *H01L 21/681* (2013.01); *H01L 21/67144* (2013.01); *H01L 33/62* (2013.01); *H01L 2933/0066* (2013.01)

(58) Field of Classification Search
CPC . H01L 21/681; H01L 33/62; H01L 21/67144; H01L 2933/0066; H01L 31/0203; H01L 31/0481; H01L 31/0488; H01L 33/52; H01L 33/56; H01L 31/048; H01L 21/56; H01L 23/28; H01L 23/29; H01L 23/295; H01L 23/3135; H01L 27/1214; H01L 23/3192; H01L 23/3164; H01L 21/02074; H01L 21/28088; H01L 21/32115; H01L 29/4966; H01L 29/0649; H01L 29/7851; G03F 7/091; G03F 7/094

See application file for complete search history.

(56) References Cited

U.S. PATENT DOCUMENTS

| | | |
|---|---|---|
| 5,372,853 A | 12/1994 | Roberto |
| 9,162,880 B2 | 10/2015 | Higginson et al. |
| 9,308,649 B2 | 4/2016 | Golda et al. |
| 9,318,475 B2 | 4/2016 | Bibl et al. |
| 9,624,100 B2 | 4/2017 | Bathurst et al. |
| 9,768,345 B2 | 9/2017 | Hu et al. |
| 9,842,782 B2 | 12/2017 | Chen et al. |
| 10,073,043 B2 | 9/2018 | Jeanne et al. |
| 10,183,401 B2 | 1/2019 | Higginson et al. |
| 2002/0096994 A1 | 7/2002 | Iwafuchi et al. |
| 2010/0003119 A1* | 1/2010 | Nakamura ........ H01L 21/67132 414/800 |

(Continued)

FOREIGN PATENT DOCUMENTS

JP    2002141487 A    5/2002

*Primary Examiner* — Thanh T Nguyen
(74) *Attorney, Agent, or Firm* — Faegre Drinker Biddle & Reath LLP

(57) ABSTRACT

A method for transferring components from a transfer head to a receiving substrate is disclosed. The method includes monitoring signals indicative of a pitch mismatch between locations on the transfer head and locations on the receiving substrate and actuating at least one actuator based at least in part on the monitored signals to reduce the mismatch of the pitch of the locations on the transfer head and the locations on the receiving substrate.

15 Claims, 9 Drawing Sheets

(56) References Cited

U.S. PATENT DOCUMENTS

| | | |
|---|---|---|
| 2011/0038150 A1 | 2/2011 | Woodgate et al. |
| 2015/0371585 A1 | 12/2015 | Bower et al. |
| 2015/0371874 A1 | 12/2015 | Bower et al. |
| 2016/0016399 A1 | 1/2016 | Bower et al. |
| 2016/0372628 A1 | 12/2016 | Henley et al. |
| 2017/0162552 A1 | 6/2017 | Thompson |
| 2017/0287789 A1 | 10/2017 | Bower et al. |
| 2017/0288102 A1 | 10/2017 | Farrens et al. |
| 2017/0373046 A1 | 12/2017 | Gardner et al. |
| 2018/0138071 A1 | 5/2018 | Bower et al. |
| 2018/0194014 A1 | 7/2018 | Bibl et al. |
| 2018/0277524 A1* | 9/2018 | Moon .................... H01L 33/22 |
| 2018/0374829 A1 | 12/2018 | Henley |
| 2020/0105570 A1* | 4/2020 | Peterson ................ H01L 24/75 |

* cited by examiner

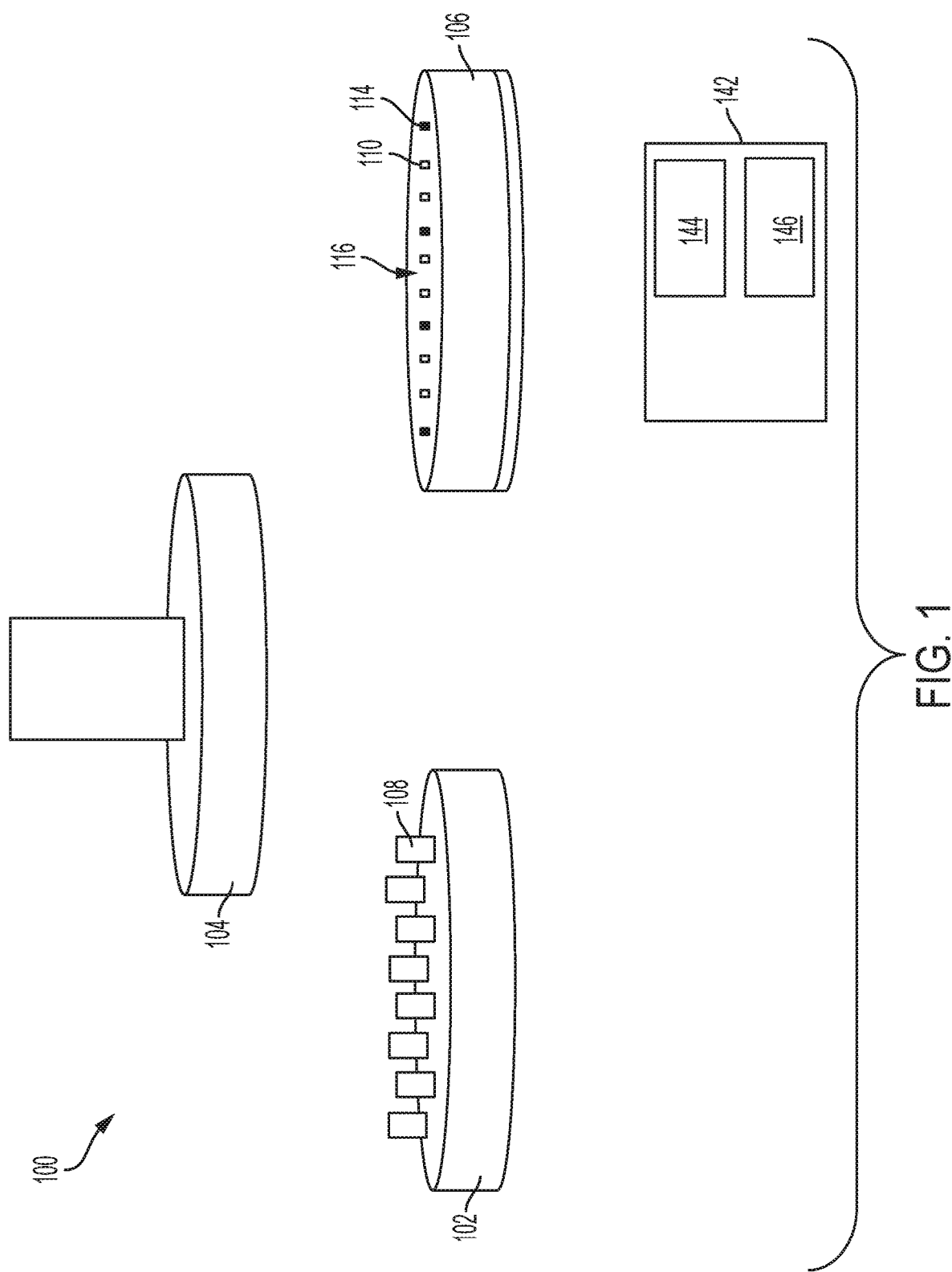

MICRO-COMPONENT BATCH TRANSFER SYSTEMS, METHODS, AND DEVICES

SUMMARY

In certain embodiments, a system for transferring components from a transfer head to a receiving substrate is disclosed. The system includes a computing device with circuitry and memory, which includes instructions for execution by the circuitry. The instructions cause the circuitry to monitor signals indicative of a pitch mismatch between locations on the transfer head and locations on the receiving substrate and actuate one or more actuators based on the monitored signals to cause in-plane expansion or in-plane contraction of at least one of the transfer head and the receiving substrate to reduce the mismatch of the pitch of the locations on the transfer head and the locations on the receiving substrate.

In certain embodiments, a system includes a transfer head configured to carry components, a substrate having a receiving surface configured to receive the components from the transfer head, and actuators coupled to at least one of the transfer head and the substrate and configured to be actuated to cause in-plane expansion or in-plane contraction of the at least one of the transfer head and the substrate.

In certain embodiments, a method for transferring components from a transfer head to a receiving substrate is disclosed. The method includes monitoring signals indicative of a pitch mismatch between locations on the transfer head and locations on the receiving substrate and actuating at least one actuator based at least in part on the monitored signals to reduce the mismatch of the pitch of the locations on the transfer head and the locations on the receiving substrate.

While multiple embodiments are disclosed, still other embodiments of the present disclosure will become apparent to those skilled in the art from the following detailed description, which shows and describes illustrative embodiments of the disclosure. Accordingly, the drawings and detailed description are to be regarded as illustrative in nature and not restrictive.

BRIEF DESCRIPTION OF THE DRAWINGS

FIG. 1 shows a schematic of a transfer system for electrical components, in accordance with certain embodiments of the present disclosure.

Figure 2A:
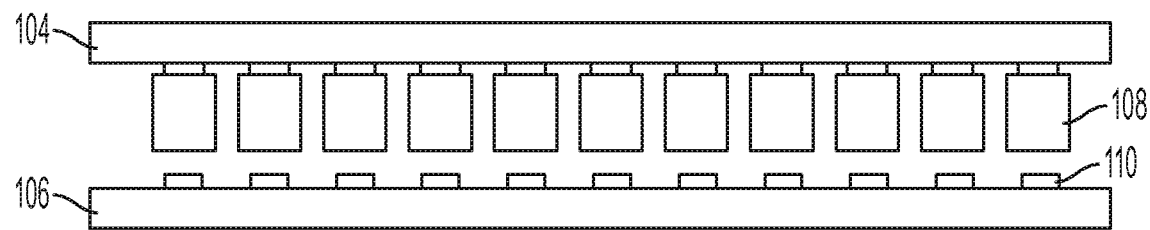
FIGS. 2A-2C show a schematic side view of components of the system of FIG. 1 at various stages during a transfer of the electrical components, in accordance with certain embodiments of the present disclosure.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope of the appended claims.

DETAILED DESCRIPTION

Manufacturing high-resolution displays (e.g., displays for smartwatches, smartphones, tablets, laptops, televisions, augmented reality headsets) or sensor devices often requires transfer of many small electronic components (e.g., micro/nano-sized components such as microLEDs or sensors) from one substrate (e.g., a transfer head) onto another substrate (e.g., a receiving substrate). Manufacturing displays efficiently in high volume involves processes for high-speed batch-transfer of such electronic components. One concern with batch-transfer processes is variations in the pitch mismatch (e.g., lateral misalignment) between the substrates. This mismatch can be caused, for example, by different coefficients of thermal expansion between the substrates. As will be explained in more detail below, this mismatch can result in some components not transferring properly to the receiving substrate. Certain embodiments of the present disclosure involve systems, methods, and devices for compensating for variations between substrates.

FIG. 1 shows a system 100 for transferring electrical components in batches. The system 100 includes a source substrate 102, a transfer head 104 (e.g., a transfer coupon, a stamp, a donor substrate, an interposer), and a receiving substrate 106 (e.g., a backplane circuit for a display, an intermediate substrate for additional transfer processing). During assembly, the transfer head 104 transfers electrical components 108 such as microLEDs or sensors from the source substrate 102 to the receiving substrate 106 by picking up the electrical components 108 from the source substrate 102 and placing the electrical components 108 on the receiving substrate 106. The transfer head 104 can carry thousands of electrical components 108 at a time. The electrical components 108 can be picked and placed in groups (e.g., by color of microLED) or as an entire array of hundreds of thousands of microLEDs.

Figure 2B:
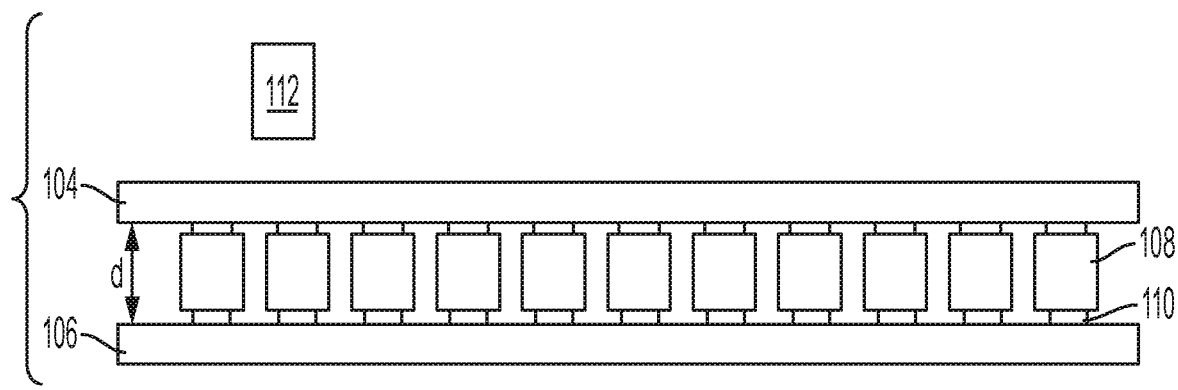
Figure 2C:
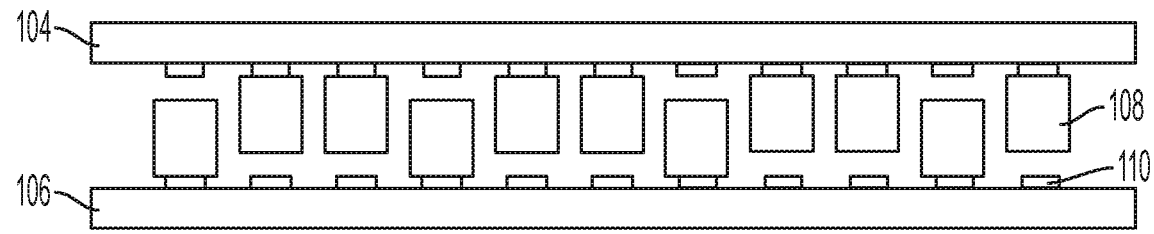

FIGS. 2A-2C show stages of the process of transferring the electrical components 108 from the transfer head 104 to the receiving substrate 106. FIG. 2A shows the transfer head 104 positioned above the receiving substrate 106 such that the electrical components 108 are aligned with respective bond pads 110 on the receiving substrate 106. The transfer head 104 and/or the receiving substrate 106 are moved closer to each other such that the electrical components 108 contact the bond pads 110, as shown in FIG. 2B.

In certain embodiments, the electrical components 108 are mechanically coupled and electrically coupled to the bond pads 110 by reflowing solder or a solder-like materials via selective heating of the receiving substrate 106. In certain embodiments, the electrical components 108 are first mechanically coupled to the bond pads 110 via an adhesive, electrostatic forces, and the like. Once the electrical components 108 are coupled (e.g., mechanically coupled and/or electrically coupled) to the bond pads 110, the electrical components 108 can be released from the transfer head 104 using a variety of methods, including utilizing lasers, adhesive forces, electrostatic forces, MEMS-based devices, magnetics, and the like. For example, the system 100 can include one or more lasers 112 (shown in FIG. 2B) that emit light that is directed towards the transfer head 104. The transfer head 104 can include a release layer that is ablated or otherwise damaged by the emitted light such that the underlying electrical components 108 are released from the transfer head 104. In such arrangements, the transfer head 104 may include a substrate that is optically transparent to the wavelength of the emitted light. The emitted light can be selectively activated and directed such that all or only a portion of the electrical components 108 are released from the transfer head 104. As shown in FIG. 2C, after the desired electrical components 108 are coupled to the receiving substrate 106 and released from the transfer head 104, the transfer head 104 and the receiving substrate 106 can be moved away from each other. The transfer head 104 can then pick up additional electrical components 108 from the source substrate 102 or another source substrate and repeat the process of transferring the electrical components 108. As mentioned previously, the electrical components 108 can be picked and placed in groups such that only a desired subset (e.g., one color of microLED) of the electrical components 108 are transferred to the receiving substrate 106 at a given time.

As mentioned above, one potential problem or concern with batch-transfer processing is pitch mismatch between the transfer head 104 and the receiving substrate 106. This pitch mismatch can be caused, for example, by different coefficients of thermal expansion between the transfer head 104 and the receiving substrate 106. For example, a transfer head 104 made from sapphire can have a coefficient of thermal expansion that is greater than a receiving substrate 106 made from silicon. If pitch mismatch is not corrected, some electrical components 108 may not be transferred properly to the receiving substrate 106.

Figure 3A:
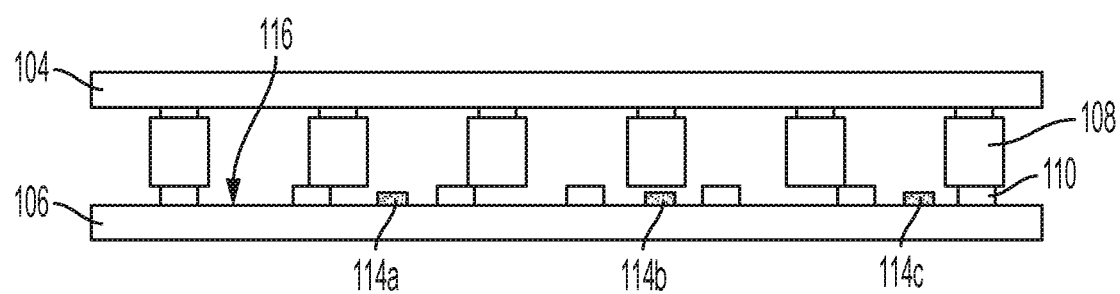
FIGS. 3A and 3B show a schematic side view of components of the system of FIG. 1 at various stages during a transfer of electrical components, in accordance with certain embodiments of the present disclosure.

FIG. 3A shows an example of the transfer head 104 and the receiving substrate 106 having a pitch mismatch between the two. At the stage shown in FIG. 3A and given the pitch mismatch, the electrical components 108 positioned at or near the middle of FIG. 3A would likely fail to transfer properly from the transfer head 104 to the receiving substrate 106.

In certain embodiments, the system 100 includes one or more actuators 114 that can be used to expand or contract one or more of the transfer head 104 and the receiving substrate 106 to match the pitch of the locations of the electrical components 108 on the transfer head 104 and the pitch of the locations of the bond pads 110 on the receiving substrate 106. The spacing and/or number of the actuators 114 on the transfer head 104 and/or the receiving substrate 106 depends on the desired pitch of the electrical components 108 and on the temperature range of the transfer process, among other factors.

In embodiments, one or both of the transfer head 104 and the receiving substrate 106 can include actuators, such as the actuators 114. In some embodiments, the actuators 114 can be disposed on a top surface of the receiving substrate 106 and/or the transfer head 104. In some embodiments, the actuators 114 can be disposed inside or embedded in the receiving substrate 106 and/or the transfer head 104. In some embodiments, the actuators 114 can be disposed below or above the receiving substrate 106 and/or the transfer head 104. Also, in embodiments, the transfer head 104 and/or the receiving substrate 106 includes circuitry that is electrically coupled to the actuators 114 to control the actuators 114 or circuitry and can be added to the transfer head 104 and/or the receiving substrate 106 and electrically coupled to the actuators 114 to control the actuators 114.

Figure 3B:
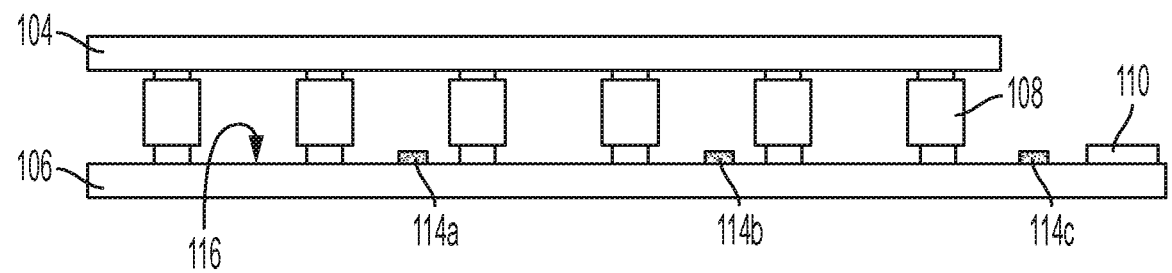

For example, as illustrated in FIGS. 1, 3A, and 3B, the actuators 114, including actuators 114a-114c, are coupled to a receiving surface 116 of the receiving substrate 106 and controlled (e.g., individually controlled) to flex or expand the receiving substrate 106. For example, the actuators 114 can be controlled to cause in-plane expansion of the receiving substrate 106 (and/or the transfer head 104 in embodiments). Put another way, actuation of one or more of the actuators 114 can cause the receiving substrate 106 and/or the transfer head 104 to expand or contract in one or more lateral directions (e.g., into or out of the page of FIGS. 3A and 3B and to-and-from the left and right sides of the page). This causes the locations of the bond pads 110 on the receiving substrate 106 to align with and match the locations of the electrical components 108 on the transfer head 104 as shown in FIG. 3B, correcting the pitch mismatch. In some embodiments, the receiving substrate 106 includes one or more of polycrystiline silicon, such as low temperature polycrystiline silicon, plastic, and a polymer.

FIG. 3B shows the receiving substrate 106 being expanded by the actuators 114a-114c to match the pitch of the bond pads 110 on the receiving substrate 106 to the pitch of the electrical components 108 on the transfer head 104. In other embodiments, the actuators 114 can be coupled to only the transfer head 104 or each of the transfer head 104 and the receiving substrate 106 can have actuators, such as the actuators 114, coupled to it and controlled to match the pitch of the electrical components 108 on the transfer head 104 to the pitch of the bond pads 110 on the receiving substrate 106.

As described in more detail below, the actuators 114 can be actuated in response to various measurements such as measurements indicating a pitch mismatch between the electrical components 108 on the transfer head 104 and the bond pads 110 on the receiving substrate 106.

In certain embodiments, the actuators 114 are thermal actuators or heaters that flex or expand the transfer head 104 and/or the receiving substrate 106 to compensate for variations in lateral pitch mismatch or other pitch mismatch between the transfer head 104 and the receiving substrate 106. For example, in some embodiments, the actuators 114 are resistive heaters that induce local thermal expansion when an electric power is applied across the resistive heaters. Put another way, when the actuators 114 are heated, the heat transfers to the transfer head 104 and/or the receiving substrate 106, which locally deform according to their respective coefficients of thermal expansion. This electrically induced thermal expansion compensates for the pitch mismatch between the transfer head 104 and the receiving substrate 106. The thermal actuator or resistive element may be made from metal, such as tantalum and tungsten, semiconductor material, such as polycrystalline silicon, conductive oxide materials, or a combination of the above.

In some embodiments, the actuators 114 can be mechanical actuators (e.g., electro-mechanical actuators) such as piezo-based actuators, voice-coil-based actuators, or magnetorestriction-based actuators. For example, the actuators 114 can be electrically coupled to a power source, which selectively applies a current or voltage to the actuators 114 to expand or contract the actuators 114.

Figure 4:
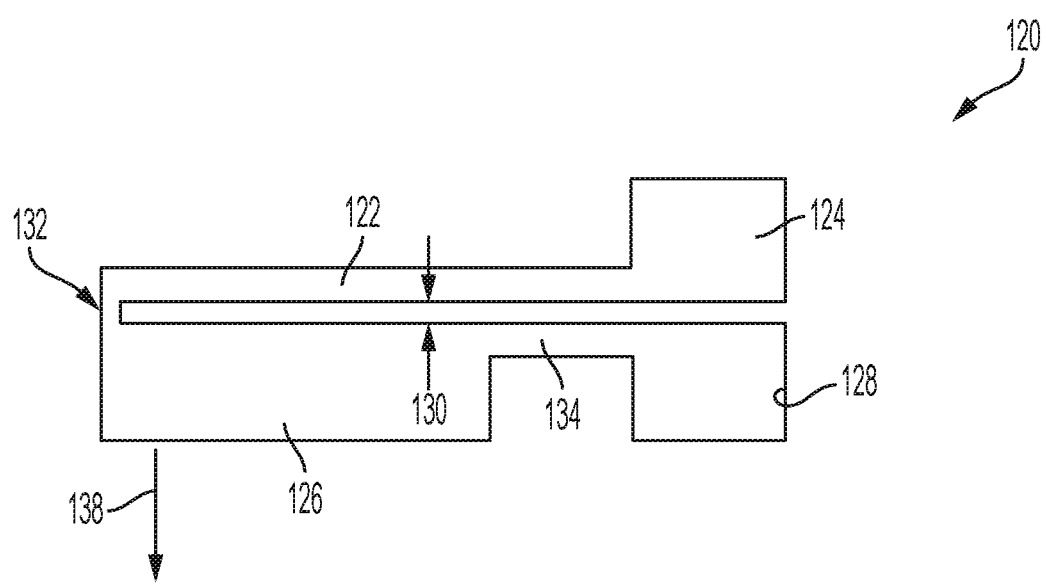
FIG. 4 shows a top-down diagram illustrating one example of a thermal actuator, in accordance with certain embodiments of the present disclosure.

FIG. 4 is a top-down diagram illustrating one example of a thermal actuator 120, in accordance with certain embodiments of the present disclosure. In this example, the thermal actuator 120 is made of polycrystalline silicon. In other example embodiments, the thermal actuator 120 can be made from metal, such as tantalum and tungsten, semiconductor material, such as polycrystalline silicon, conductive oxide materials, or a combination of the above. In embodiments, one or more of the actuators 114 is similar to the thermal actuator 120.

The thermal actuator 120 is a resistive actuator including a thin hot arm 122 connected to a first anchor 124 and a thick cold arm 126 connected to a second anchor 128. The hot arm 122 and the cold arm 126 are separated by a gap 130 and connected together at an end 132 of the thermal actuator 120 that is opposite the anchors 124 and 128. Also, the cold arm 126 is connected to the second anchor 128 by a thinner flexure arm 134 that allows for flexing of the thermal actuator 120.

In operation, a current is applied to the thermal actuator 120, such as flowing from the first anchor 124 to the second anchor 128. This current heats the hot arm 122 more than the cold arm 126, such that the hot arm 122 expands more than the cold arm 126 and the device bends or flexes in the direction indicated by arrow 138.

Although only a few actuators 114 are shown in the figures, the system 100 can have hundreds or thousands of actuators 114 that are individually addressable that act to shape the transfer head 104 and/or the receiving substrate 106. For example, each actuator 114 can be associated with a portion of the transfer head 104 or the receiving substrate 106 such that a given actuator 114 controls local expansion/contraction in one area of the transfer head 104 or the receiving substrate 106, and another actuator 114 controls local expansion/contraction in another area of the transfer head 104 or the receiving substrate 106. Also, in the present examples, the pitch mismatch is shown in one lateral dimension, however, pitch mismatch may also be a concern in other directions, such as a direction perpendicular to the one shown. In that case, actuators 114 can be provided on one or more of the transfer head 104 and the receiving substrate 106 in the other directions to compensate for pitch mismatch in those directions.

In reference to actuators 114 that may include thermal actuator 120, in order to know which actuators 114 to activate and to what extent, the system 100 can use various methods to measure the pitch mismatch between the transfer head 104 and the receiving substrate 106. As will be described in more detail below, the disclosed methods can measure pitch mismatch at multiple points such that the actuators 114 can be used to control the shape, such as the length, of the transfer head 104 and/or the receiving substrate 106 at several points along the transfer head 104 and/or the receiving substrate 106. For example, an actuator 114 can be associated with each measured point to correct the shape of the transfer head 104 and/or the receiving substrate 106 at or near the measured point. The methods described below take advantage of the fact that the transfer head 104 and/or the receiving substrate 106 already contains circuitry that can be measured and/or probed during the transfer process.

Referring back to FIG. 1, the system 100 includes one or more computing devices 142 (e.g., personal computers, laptops, servers, or controllers) that contain one or more processors 144 and memory 146 that receive measurements (e.g., measurements indicating pitch mismatch or degree of contact) and control activation of the actuators 114. For example, the methods disclosed herein and outlined in the figures can be implemented using computer-readable instructions/code that are stored in the memory 146 for execution by circuitry of the one or more processors 144 of the computing devices 142. The one or more computing devices 142 and its components are communicatively and electrically coupled to other components (e.g., sensors, actuators) of the system 100.

Figure 5:
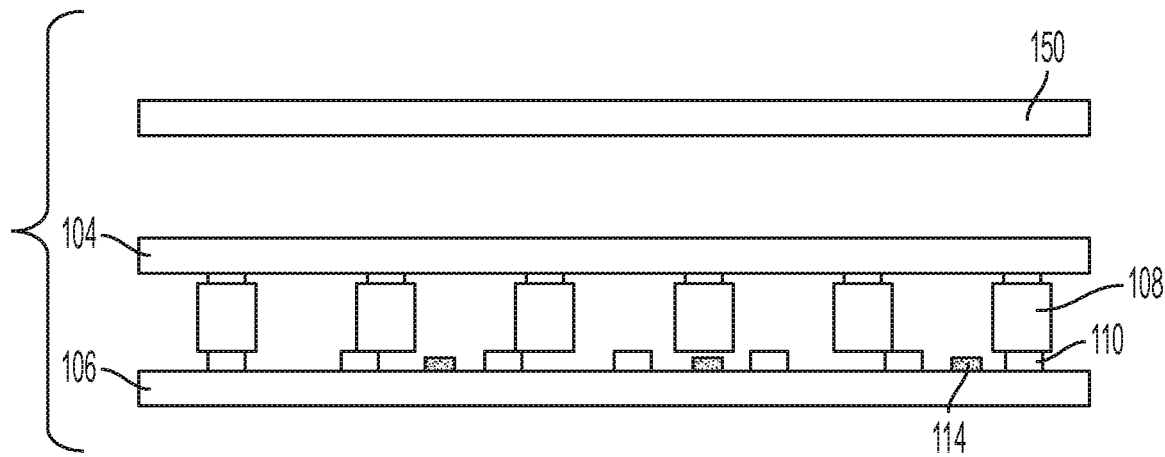
FIG. 5 shows a schematic side view of a system utilizing a photoelectric measurement approach, in accordance with certain embodiments of the present disclosure.
Figure 6:
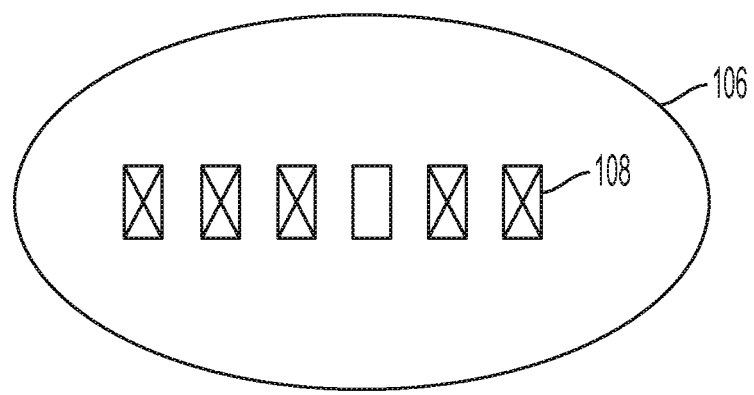
FIG. 6 shows a schematic top view of a system utilizing the photoelectric measurement approach of FIG. 5, in accordance with certain embodiments of the present disclosure.
Figure 7:
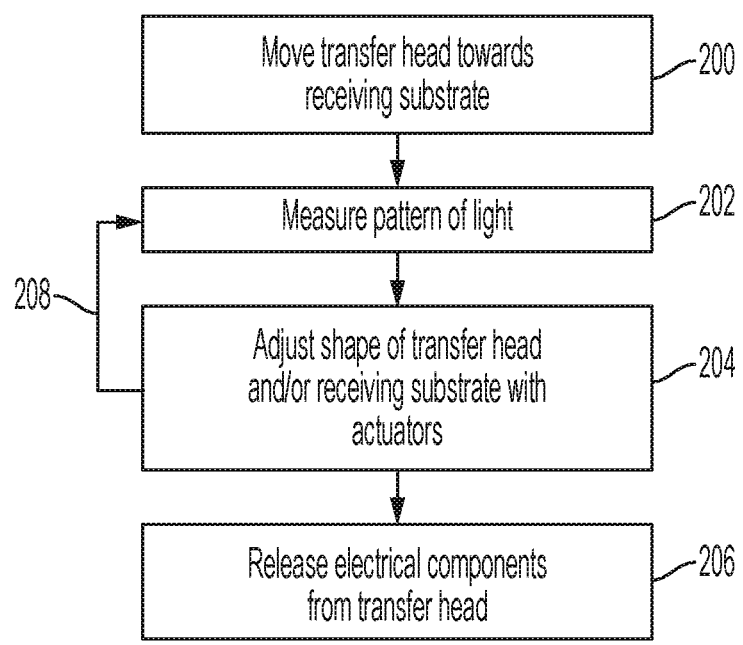
FIG. 7 shows a block diagram of various steps for carrying out the photoelectric measurement approach of FIGS. 5 and 6, in accordance with certain embodiments of the present disclosure.

FIGS. 5-7 show features and steps that utilize photoelectric measurements during a batch-transfer of the electrical components 108. For this method, the transfer head 104 can include a transparent electrical contact layer that allows current to flow from the receiving substrate 106 through the electrical components 108 as the receiving substrate is energized. The individual electrical components 108 electrically coupled to the receiving substrate 106 will become energized (e.g., emit light if the electrical components 108 are LEDs), and the individual electrical components 108 not electrically coupled will not be energized.

As the transfer head 104 is moved towards the receiving substrate 106 (block 200 in FIG. 7), the electrical components 108 will begin to electrically couple to the receiving substrate 106. For example, FIG. 6 shows a view through the transfer head 104 of five electrical components 108 being energized (represented by solid black rectangles) and the remaining electrical components not energized. The system 100 can include a detector 150 (e.g., an optical detector such as a camera or an array of photodetectors) positioned behind the transfer head 104. The detector 150 can measure the pattern of light output across all electronic devices 108 being transferred or perhaps across one or more rows of electrical components 108 (block 202 in FIG. 7). Based on the detected light emitted by the electrical components 108 (or lack of light in certain areas), the system 100 can actuate one or more of the actuators 114 to adjust the shape, such as the length and/or width, of the transfer head 104 and/or the receiving substrate 106 (block 204 in FIG. 7) to match the pitch of locations of the electrical components 108 on the transfer head 104 to the pitch of locations of the bond pads 110 on the receiving substrate 106. The actuators 114 can be actuated such that the actuators 114 expand or contract the transfer head 104 and/or the receiving substrate 106 such that the actuators 114 cause the transfer head 104 and/or the receiving substrate 106 to deform.

During the transfer process, the detector 150 can continuously detect light emitted by the electrical components 108. For example, the transfer process can include a feedback loop 208 between the measurements of the pattern of light and the actuation of the actuators 114 that helps facilitate real-time adjustment of the actuators 114. Once an acceptable number of electrical components 108 are energized (e.g., once the transfer head 104 and/or the receiving substrate 106 have a more uniform distribution of contact), the actuators 114 can be locked into position and the electrical components 108 released from the transfer head 104 (block 206 in FIG. 7). The transfer head 104 can then be moved away from the base assembly and be prepared to pick up another set of electrical components (e.g., LEDs that emit a different wavelength of light) for transferring to the same receiving substrate 106 or to a different receiving substrate.

Figure 8:
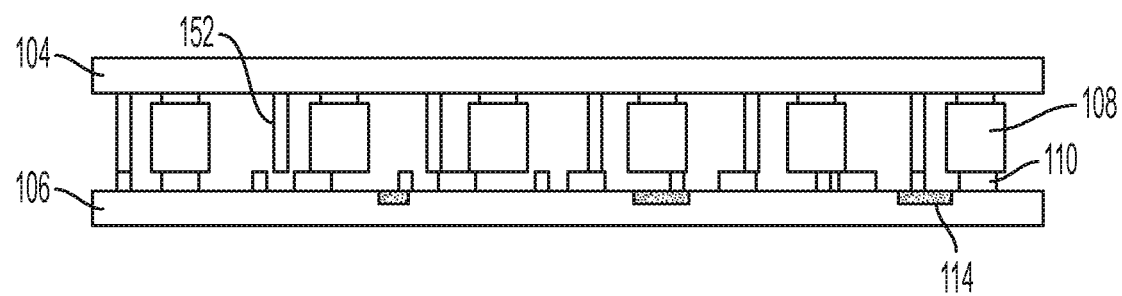
FIG. 8 shows a schematic side view of a system utilizing a conductive measurement approach, in accordance with certain embodiments of the present disclosure.
Figure 9:
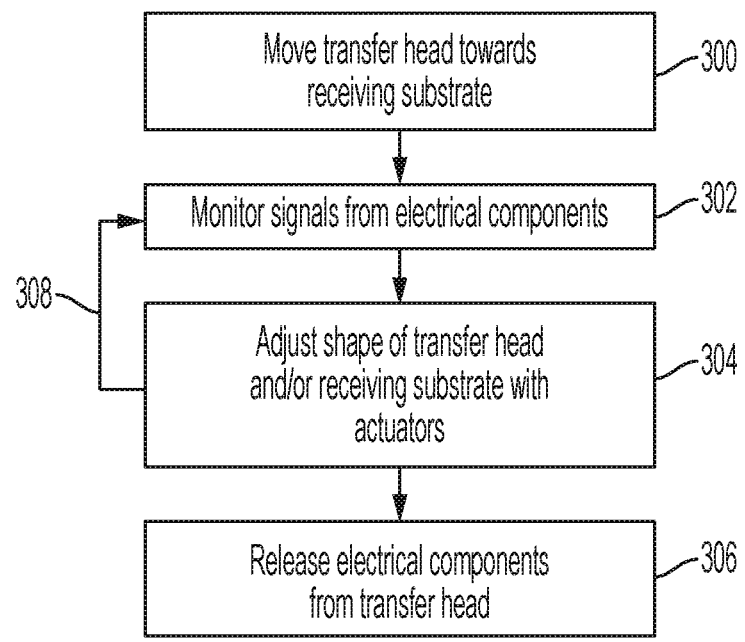
FIG. 9 shows a block diagram of various steps for carrying out the conductive measurement approach of FIG. 8, in accordance with certain embodiments of the present disclosure.

FIGS. 8 and 9 show features and steps that utilize conductivity measurements during a batch-transfer of the electrical components 108. For this method, circuitry of the transfer head 104 and/or the receiving substrate 106 can be used to monitor current, voltage, or resistance of the individual electrical components 108 as contact is made between the electrical components 108 and the receiving substrate 106.

As the transfer head 104 is moved towards the receiving substrate 106 (block 300 in FIG. 9), the electrical components 108 will begin to electrically couple to the receiving substrate 106. Signals from the individual electrical components 108 can be monitored for indications that the electrical components 108 are electrically coupled to the receiving substrate 106 (block 302 in FIG. 9). Based on the signals, the system 100 can actuate one or more of the actuators 114 to adjust the shape, such as the length and/or width, of the transfer head 104 and/or the receiving substrate 106 (block 304 in FIG. 9) to match the pitch of locations of the electrical components 108 on the transfer head 104 to the pitch of locations of the bond pads 110 on the receiving substrate 106. For example, areas without a minimum percentage of energized electrical components 108 can be the areas targeted for shaping. The actuators 114 can be actuated such that the actuators 114 expand or contract the transfer head 104 and/or the receiving substrate 106 such that the actuators 114 cause the transfer head 104 and/or the receiving substrate 106 to deform. During the transfer process, the system 100 can continuously monitor the signals from the electrical components 108. For example, the transfer process can include a feedback loop 308 between the measurements of the signals from the electrical components 108 and the actuation of the actuators 114 that helps facilitate real-time adjustment of the actuators 114. Once an acceptable number of electrical components 108 are energized, the actuators 114 can be locked into position and the electrical components 108 released from the transfer head 104 (block 306 in FIG. 9).

Alternatively, the transfer head 104 and/or the receiving substrate 106 can include an array of conductive pillars 152 to be electrically coupled to a circuit trace on the the transfer head 104 and/or the receiving substrate 106. The conductive pillars 152 would be a similar height as the electrical components 108. As the transfer head 104 approaches the receiving substrate 106, the system 100 could monitor the current flowing between each of the conductive pillars 152 and the receiving substrate 106, and could locally or otherwise adjust the shape of the transfer head 104 and/or the receiving substrate 106 to compensate for variations.

Figure 10:
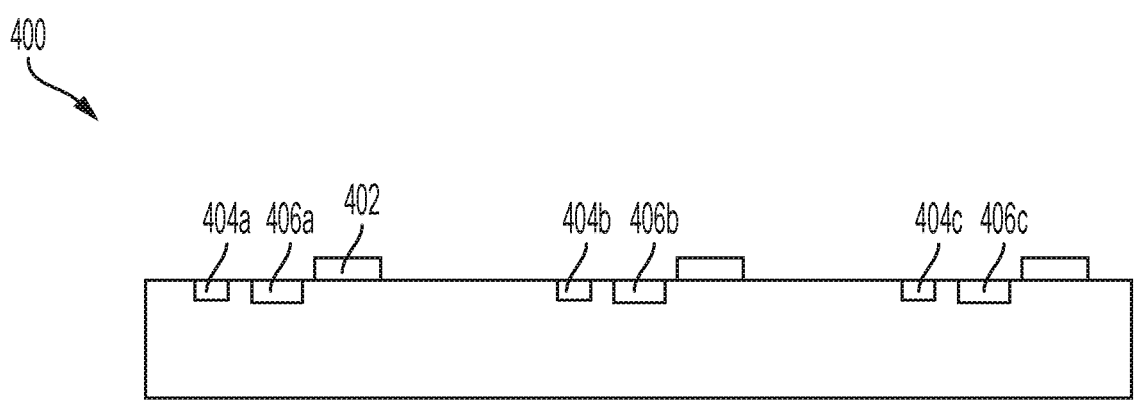
FIG. 10 shows a schematic side view of a substrate, in accordance with certain embodiments of the present disclosure.

FIG. 10 shows a substrate 400 (e.g., a transfer head or a receiving substrate) for transferring and/or receiving electrical components in batches. The substrate 400 could be used as the transfer head 104 or the receiving substrate 106 in the system 100 described above. The substrate 400 can include bond pads 402 for mechanically and electrically coupling to electrical components. The substrate 400 also includes heaters 404a-404c and push blocks 406a-406c that are arranged and can be controlled to help mitigate pitch mismatch between the substrate 400 and another substrate. For example, the heaters 404a-404c and the push blocks 406a-406c can be used to actuate in-plane expansion or contraction of the substrate 400. Although the heaters 404a-404c and the push blocks 406a-406c are shown as being embedded in the substrate 400, the heaters 404a-404c and the push blocks 406a-406c can be disposed on a surface of the substrate 400.

In certain embodiments, the heaters 404a-404c are resistive heaters that induce local thermal expansion when an electric power is applied across the resistive heaters. The push blocks 406a-406c can be made of a material (e.g., materials comprising copper and/or nickel such as NiCu) with a high coefficient of thermal expansion. In certain embodiments, the material has a coefficient of thermal expansion that is greater than the coefficient of thermal expansion of the substrate 400. Because of the material's coefficient of thermal expansion, the push blocks 406a-406c can multiply or otherwise increase the rate of expansion of the substrate 400 when the heat generated by the heaters 404a-404c heats the push blocks 406a-406c. As such, when the heaters 404a-404c generate heat, the respective push blocks 406a-406c expand. This induced thermal expansion helps compensate for the pitch mismatch between the substrate 400 and another substrate.

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

We claim:

1. A system for transferring components from a transfer head to a receiving substrate, the system comprising:
a computing device including circuitry and memory with instructions for execution by the circuitry to:
monitor signals indicative of a pitch mismatch between locations on the transfer head and locations on the receiving substrate, and
actuate one or more actuators based on the monitored signals to cause in-plane expansion or in-plane contraction of at least one of the transfer head and the receiving substrate to reduce the mismatch of the pitch of the locations on the transfer head and the locations on the receiving substrate.

2. The system of claim 1, wherein the one or more actuators are coupled to the receiving substrate and actuated to cause expansion or contraction of the receiving substrate.

3. The system of claim 1, wherein the one or more actuators are coupled to the transfer head and actuated to cause the expansion or contraction of the transfer head.

4. The system of claim 1, wherein at least one of the one or more actuators is one of a mechanical actuator, an electro-mechanical actuator, and a thermal actuator.

5. The system of claim 1, wherein the monitored signals include signals indicative of light emitted from the components being transferred to the receiving substrate.

6. The system of claim 5, comprising an optical detector configured to detect the light emitted from the components and generate the signals.

7. The system of claim 1, wherein the signals include signals generated by the components being transferred to the receiving substrate.

8. The system of claim 1, comprising conductive pillars positioned between the transfer head and the receiving substrate and arranged to generate the signals.

9. A system comprising:
a transfer head configured to carry electrical components;

a substrate having a receiving surface configured to receive the electrical components from the transfer head; and actuators coupled to at least one of the transfer head and the substrate and configured to be actuated to cause in-plane expansion or in-plane contraction of the at least one of the transfer head and the substrate.

10. The system of claim 9, wherein at least one of the actuators is a thermal actuator configured to cause the expansion or the contraction of the at least one of the transfer head and the substrate based on electrical power applied to the thermal actuator.

11. The system of claim 9, wherein at least one of the actuators is configured to be independently actuated to cause the expansion or the contraction of the at least one of the transfer head and the substrate.

12. The system of claim 9, wherein at least one of the actuators is one of a mechanical actuator, an electro-mechanical actuator, and a thermal actuator.

13. The system of claim 9, wherein at least one of the actuators is a resistive thermal actuator that includes one or more of tantalum, tungsten, and polycrystalline silicon.

14. The system of claim 9, wherein at least one of the actuators is situated on the receiving surface or embedded in the substrate.

15. The system of claim 9, wherein the transfer head or the substrate further includes one or more push blocks comprising a material with a high coefficient of thermal expansion.

* * * * *